United States Patent [19]
Sekine et al.

[11] Patent Number: 5,937,300
[45] Date of Patent: Aug. 10, 1999

[54] SEMICONDUCTOR APPARATUS AND FABRICATION METHOD THEREOF

[75] Inventors: Makoto Sekine; Hidenobu Miyamoto; Ken Inoue, all of Tokyo, Japan

[73] Assignee: NEC Corporation, Japan

[21] Appl. No.: 08/950,110

[22] Filed: Oct. 16, 1997

Related U.S. Application Data

[63] Continuation of application No. 08/540,991, Oct. 11, 1995, abandoned.

[30] Foreign Application Priority Data

Oct. 12, 1994 [JP] Japan ................................... 6-245740
Jul. 4, 1995 [JP] Japan ................................... 7-168560

[51] Int. Cl.[6] .............................................. M01L 21/336
[52] U.S. Cl. ........................... 438/300; 438/303; 438/586
[58] Field of Search ................................. 438/303, 300, 438/586

[56] References Cited

U.S. PATENT DOCUMENTS 4,890,145 12/1989 Malhi ..................................... 357/23
5,352,631 10/1994 Sitaram et al. ............................ 437/44

FOREIGN PATENT DOCUMENTS 3-145162  6/1991  Japan .
3-288443 12/1991  Japan .

OTHER PUBLICATIONS

Wolf et al, "Silicon Processing For The VLSI Era vol. 1: Process Technology", Lattice Press, pp. 187–191, 397–399, 516–519, 532–534, Month Unknown 1986.

C.K. Lau, et al., "Titanium Disilicide Self–Aligned Source/ Drain + Gate Technology", International Electron Devices Meeting, 1982, pp. 714–717.

*Primary Examiner*—John F. Niebling
*Assistant Examiner*—Michael S. Lebentritt

[57] ABSTRACT

A polysilicon film is deposited on a semiconductor substrate. A PSG film that can be removed from a material that composes field oxide films and sidewalls of a side surface portion of a gate electrode with a satisfactory selective ratio is deposited on the resultant semiconductor substrate. After the deposited films are processed as a gate electrode, the sidewalls are formed on the side surface portion of the gate electrode. Thereafter, the PSG film is selectively removed and the front surface of the polysilicon film, which composes the gate electrode, is exposed. Tungsten films are deposited on the front surfaces of the polysilicon film and source and drain region formed on the semiconductor substrate. After the SiON film is formed on the resultant semiconductor substrate, contact holes and then contacts are formed on the SiON film.

11 Claims, 13 Drawing Sheets

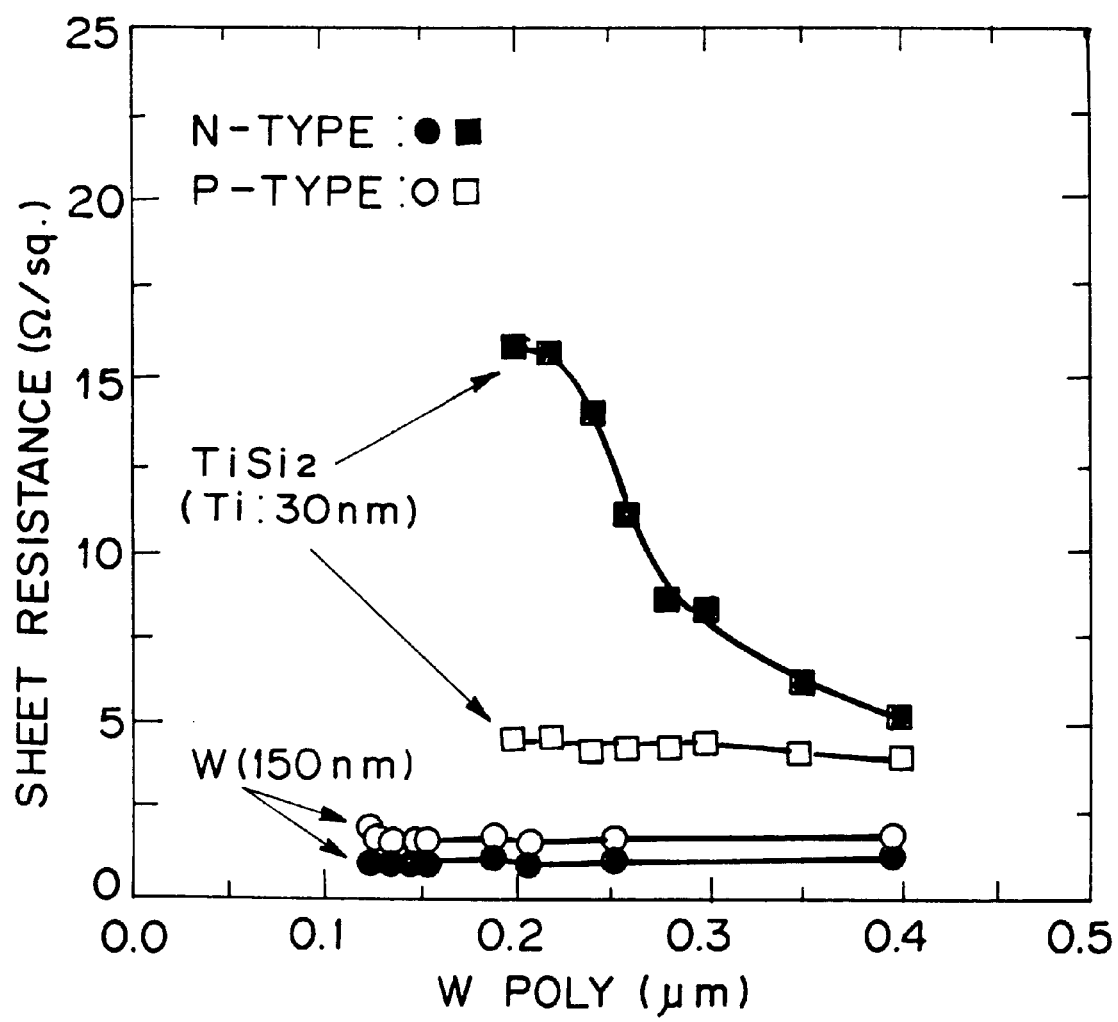

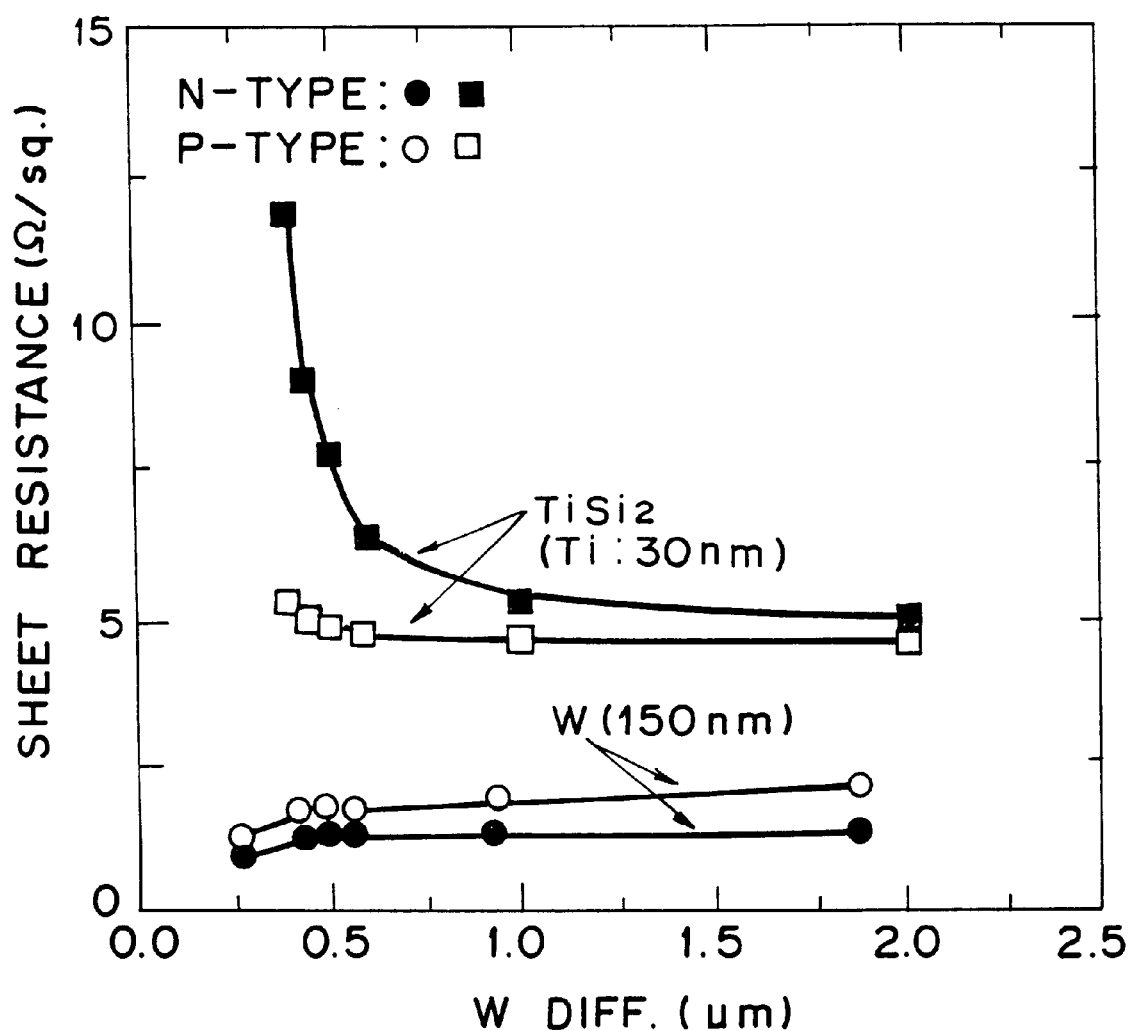

ON N TYPE GATE : 1.8 Ω/CONTACT

ON P TYPE GATE : 2.5 Ω/CONTACT

ON $N^+$ DIFFUSION LAYER : 2.3 Ω/CONTACT

ON $P^+$ DIFFUSION LAYER : 2.6 Ω/CONTACT

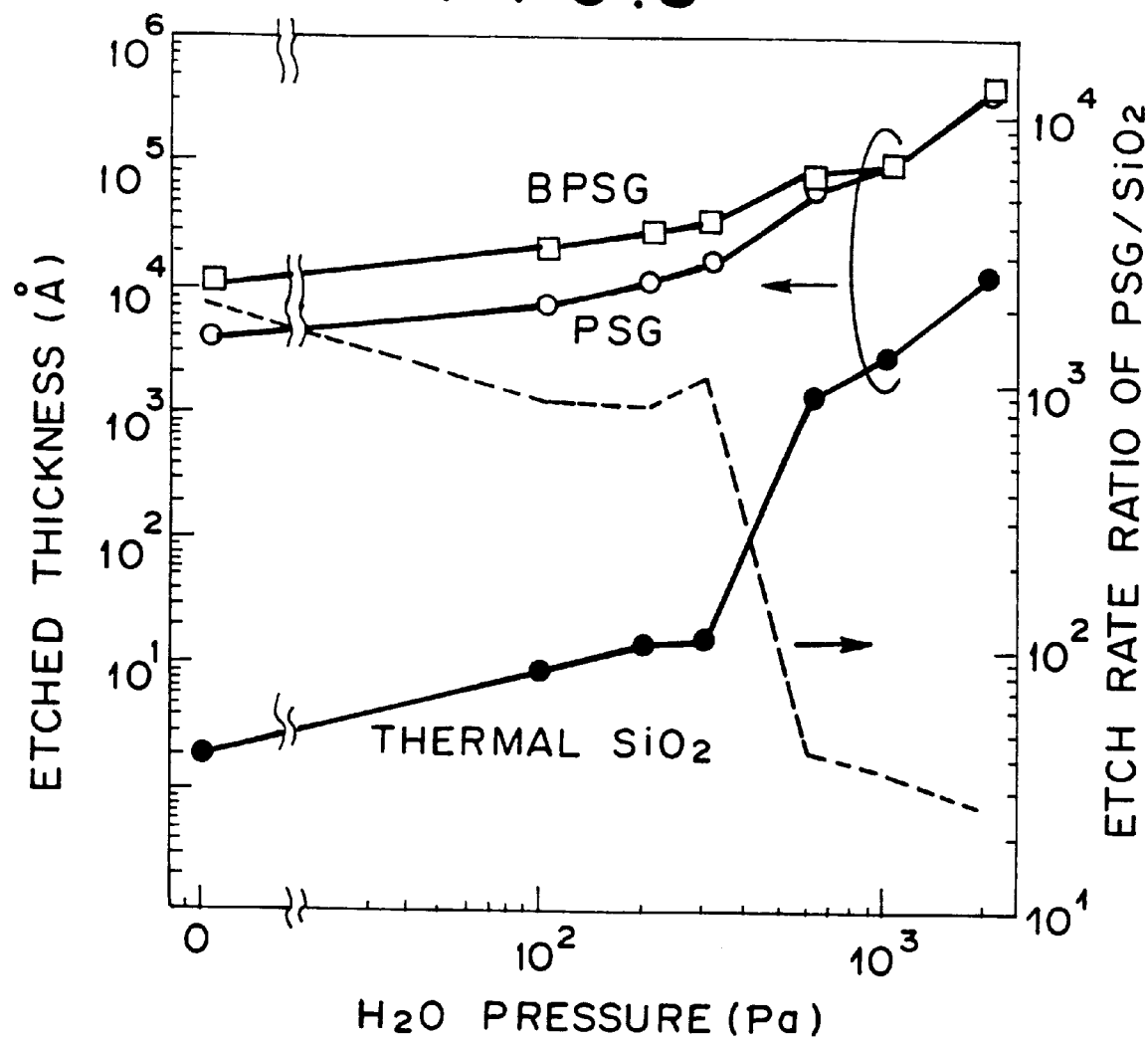

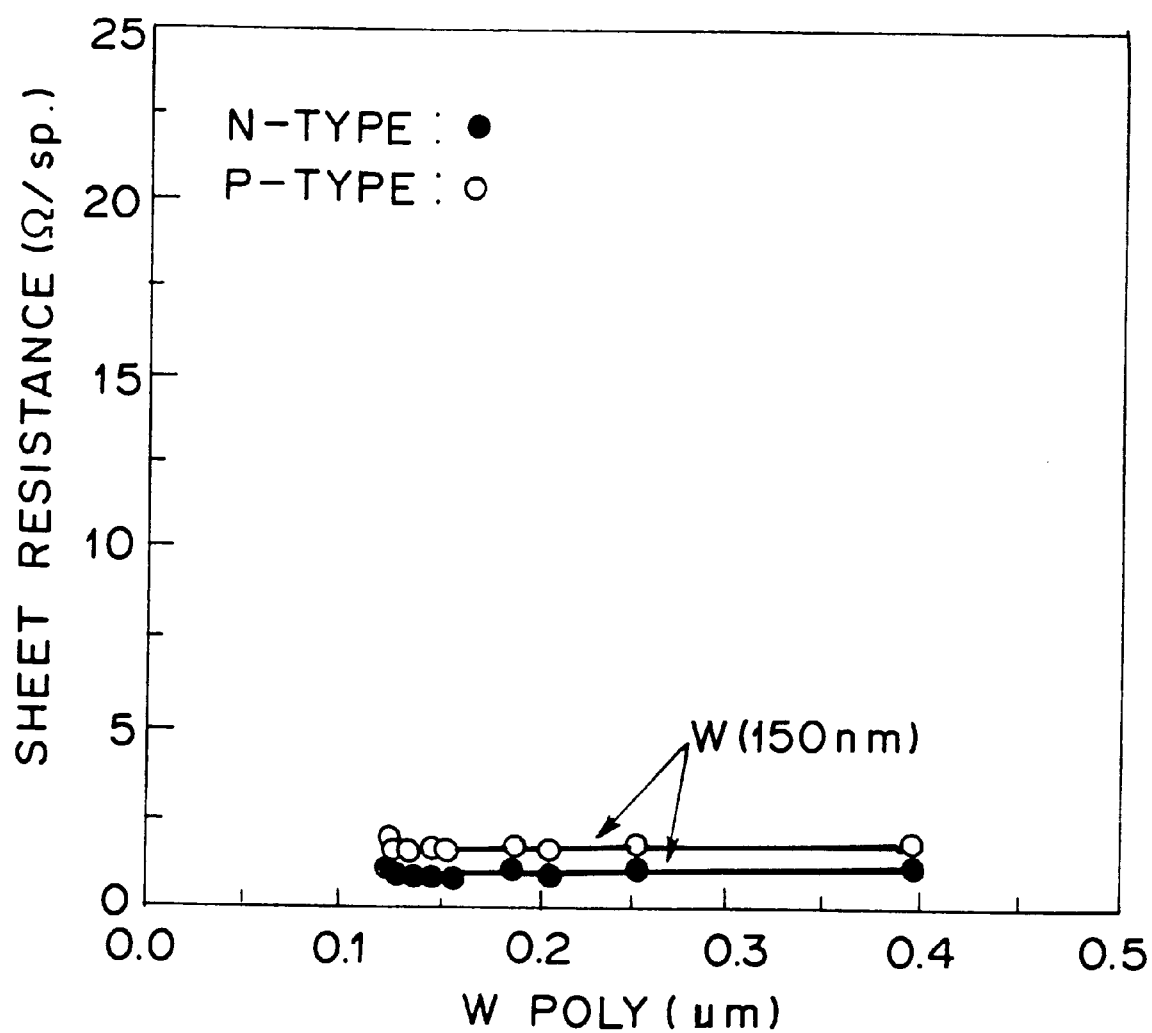

SEMICONDUCTOR APPARATUS AND FABRICATION METHOD THEREOF

This is a Continuation of application Ser. No. 08/540,991 filed on Oct. 11, 1995, now abandoned.

BACKGROUND OF THE INVENTION

1. Field of the Invention

The present invention relates to a fabrication method of a semiconductor apparatus, in particular, to a fabrication method of a semiconductor apparatus having a feature of a side wall of a gate electrode portion.

2. Description of the Related Art

In recent years, semiconductor apparatuses have been miniaturized one after another. This tendency of miniaturization is becoming strong. Thus, transistors and lead wires for use with the semiconductor apparatuses should be miniaturized. For example, in MOS transistors, their gate electrodes have been miniaturized. In addition, the impurity diffusion layers (such as source and drain region) have been shallowly formed in succession.

When the constructional parts (such as transistors) are miniaturized, the resistance of connecting parts that electrically connect the constructional parts increases. To solve this problem, as a material of the constructional parts, a low-resistance metal is used. Alternatively, by using a proper means such as ohmic contact for the connections between the constructional parts and the semiconductor portions, the resistance thereof can be prevented from increasing.

As a means for decreasing the resistance, SALICIDE (Self-ALIgned siliCIDE) method is known. In this method, the electrode portions (gate, source, and drain regions) of MOS transistors are miniaturized so as to prevent the resistance thereof from increasing. Conventionally, by contacting metal parts composed of such as titanium (Ti) to their electrodes portions, the resistance of the electrode portions is decreased. The resistance of metal parts composed of for example titanium (Ti) or zirconium (Zr) is reduced when their silicide are formed. Thus, by reacting silicon of the electrode portions with the metal parts composed of for example titanium, their silicide are formed on self-alignment basis.

Next, a related art reference of the SALICIDE process will be described.

FIGS. 13A to 13D is a vertical sectional view showing a conventional SALICIDE process described in Conference Document, "International Electron Devices Meeting, 1982", p. 714 to p. 717.

As shown in FIG. 13A, a field oxide film 803 is formed on the front surface of a semiconductor substrate 801 by the selective oxidizing method. A gate oxide film 804 and a polysilicon film 805 are successively grown in an active region surrounded by the field oxide film 803. Thereafter, the polysilicon 805 is patterned by the photolithography method and the dry etching method, which are known method so as to form a gate electrode. A sidewall 810 composed of a silicon oxide film or a silicon nitride film is formed on the side surface of the gate electrode by the CVD method and the anisotropic etching method, which are also known methods. Thereafter, as shown in FIG. 13B, an impurity region (a source and drain region) 811 is formed by the photolithography method and the ion implantation method. Next, a native oxide film is removed from the front surface of the polysilicon film 805, which is a gate electrode, and the front surface of the resultant semiconductor substrate 801. Thereafter, a titanium film 813 is deposited by the spattering method. Next, as shown in FIG. 13C, the resultant semiconductor substrate is processed by the RTA (Rapid Thermal Annealing) method in a nitrogen atmosphere. Thus, by reacting silicon of the electrode portions with the titanium film 813, a titanium silicide film 814 is formed. At this point, the titanium film 813 that is in contact with the field oxide film 803 and the sidewall 810 and a part of the titanium film 813 on the semiconductor substrate 801 are nitrided and thereby a titanium nitride film 815 is formed. Thereafter, as shown in FIG. 13D, the resultant semiconductor substrate 801 is selectively wet-etched with a mixed liquid of sulfuric acid and hydrogen peroxide solution so as to remove only the titanium nitride film 815. To reduce the resistance of the titanium silicide film 814, the RTA process is performed at a higher temperature than the temperature of the above-described RTA process. By the SALICIDE process, since the titanium silicide film 814 is formed with the gate electrode and the source and drain region are silicided on the self-alignment basis, the resistance thereof decreases. Thus, the operational speed of the resultant semiconductor apparatus is increased. In the SALICIDE process, the region of which silicide is formed can be selectively formed silicide on the self-alignment basis. In FIGS. 13A to 13D, the SALICIDE process using a titanium silicide ($TiSi_2$) film has been described. However, instead of the titanium silicide film, when cobalt silicide, nickel silicide, platinum silicide, zirconium silicide, or the like is used, the resistance thereof can be decreased in the same manner as described above.

When the resistance of the gate electrode and the source and drain region is decreased by the above-described SALICIDE method, silicon should be used to form the silicide. As semiconductor apparatuses are miniaturized, the junctions of the diffusion layers (source and drain region) becomes shallow. Thus, since the thickness of the silicide film cannot be unnecessarily increased for reducing the resistance, it is difficult to accomplish a desired resistance value.

As the silicide film becomes thin, its agglomeration is occurred by a later heat treatment. In addition, depending on the electrical characteristic such as N type and P type of the semiconductor substrate, the thickness thereof varies. Thus, it is difficult to accomplish the desired characteristic.

In the conventional SALICIDE method, since a silicide is formed by a reaction of silicon and a metal, the metal encroachment to the silicon on the semiconductor substrate is occurred. In addition, the silicide chemical reaction is affected by the crystalline characteristic of the silicon and so forth.

To solve such a problem, a method for depositing a tungsten film that is a high-melting-point and low-resistance material to a gate electrode and a source and drain region instead of using a silicide has been proposed as Japanese Patent Laid-Open Publication No. 3-145162.

In this method, as shown in FIG. 14, field oxide films 2a and 2b are formed on the front surface of a semiconductor substrate 1 by the selective oxidizing method. A gate oxide film 3 and a polysilicon film 4 orderly are formed in an active region surrounded by the field oxide films 2a and 2b on the front surface of the semiconductor substrate 1. Phosphorus is doped in the polysilicon film 4 by a known method. Thus, the electrical resistance of the polysilicon film 4 is decreased.

The polysilicon film 4 is patterned by the photolithography method and the dry etching method, which are known methods, and thereby a gate electrode is formed. Sidewalls 6a and 6b composed of a silicon oxide film or a silicon nitride film are formed on the side surface of the gate electrode by the CVD method and the anisotropic etching method, which are known methods.

After the gate electrode 4 and the sidewalls 6a and 6b are formed, a source 7a and a drain 7b are formed between the gate electrode 4 on the surface of the semiconductor substrate and the field oxide films 2a and 2b by the photolithography method and ion implantation method. Thereafter, tungsten films 13a to 13c, of which metal have high melting point and low resistance, are selectively grown on the front surfaces of the polysilicon film 4 (which is the gate electrode), the source region 7a, and the drain region 7b.

By the selective growth of the tungsten films 13a to 13c, they are formed on the front surfaces of only the polysilicon film 4, the source region 7a, and the drain region 7b. Thus, the tungsten films are not formed on other portions.

Moreover, in the conventional silicide technology, since the silicide is occurred lateral growth, the gate electrode, the source, and the drain-may short-circuit with each other.

Next, another related art reference that uses the SALICIDE process will be described. This related art reference has been disclosed as Japanese Patent Laid-Open Publication No. 3-288443. FIGS. 15A to 15H is a vertical sectional view showing the fabrication process of the related art reference. Firstly, as shown in FIG. 15A, a field oxide film 903 is selectively formed on a front surface portion of a p type silicon substrate 901 by the selective oxidizing method, which is a known method. Thereafter, a gate oxide film 904 is formed in a device region surrounded by the field oxide film 903 by the thermal oxidizing method. Thereafter, as shown in FIG. 15B, a polysilicon film 905 is deposited on the entire surface of the resultant silicon substrate by the low pressure CVD method. Next, phosphorus is diffused on the resultant silicon substrate. Thereafter, a silicon nitride film 907 is deposited on the polysilicon film 905 by, for example, the LPCVD method (Low Pressure Chemical Vapor Deposition) method. As shown in FIG. 15C, a silicon nitride film 907 and a polysilicon film 905 are patterned by a known method so as to form a multilayered gate electrode 909 on the gate oxide film 904. Thereafter, as shown in FIG. 15D, arsenic (As) ions are implanted in both the side surface portions of the multilayered gate electrode 909. Thus, a source and drain region 911 that is an impurity region is formed. Next, an insulator film such as PSG (Phospho-Silicate Glass) or NSG (Non-doped Silicate Glass) is deposited on the entire surface of the resultant semiconductor substrate by the atmospheric pressure CVD method or the like and then etched out by the anisotropic etching method. Thus, as shown in FIG. 15E, a sidewall 910 composed of the insulator film is formed on the side surface of the multilayered gate electrode 909. Thereafter, by the heat treatment for the resultant silicon substrate at a temperature of 900° C. for 30 minutes, the source and drain region 911 is activated. Next, as shown in FIG. 15F, the silicon nitride film 907 formed on the polysilicon film 905 is removed with thermal phosphoric acid. Thus, the sidewall 910 protrudes from the gate electrode composed of only the polysilicon film 904. After the resultant silicon substrate is cleaned with a fluoric acid aqueous solution, a titanium film is deposited on the entire surface of the resultant silicon substrate and then lamp-annealed in an Ar atmosphere at a temperature of 600° C. for 30 seconds. Thus, by reacting silicon of the polysilicon film 905 and the source and drain region 911, as shown in FIG. 15G, a titanium silicide film 914 is formed. On the other hand, the titanium film on the sidewall 910 and the insulator film of the field oxide film 903 are left without a chemical reaction. Thereafter, the resultant titanium film is removed with a mixture of ammonium, hydrogen peroxide, and water. The resultant silicon substrate is shown in FIG. 15G. Thereafter, conventional fabrication steps are performed. Therefore, as shown in FIG. 15H, an insulator film 918 such as a BPSG (Boro-Phospho-Silicate Glass) film is deposited on the entire surface of the silicon substrate. Next, a heat treatment is performed for planarization the surface of the resultant silicon substrate. After a contact hole 916 is opened, for example an aluminum film containing Si (1%) is deposited. Thereafter, the aluminum film is patterned and thereby a interconnection 917 is formed.

According to the fabrication method of the related art, the sidewall protrudes from the gate electrode composed of the polysilicon. Thus, when the silicide film for decreasing the resistance of the electrode portions is formed, the lateral growth of the silicide is suppressed, and thereby it is prevented the gate electrode and the source and drain region from short-circuiting with each other.

However, in the conventional SALICIDE process shown in FIG. 13, the silicide chemical reaction is suppressed due to impurities of the diffusion layer. Thus, it is difficult to form the silicide film. For example, when arsenic ions or the like are doped for forming an N type diffusion layer of a semiconductor apparatus, the arsenic ions suppress the silicide chemical reaction.

To solve such a problem, a high temperature heat treatment (for example high temperature lamp-annealing) may effectively work. However in this case, the silicide chemical reaction takes place in the lateral direction. Thus, the silicide film hangs down from the polysilicon of the gate portion to the sidewall and protrudes from the diffusion layer to the sidewall, thereby causing them to contact and to form a short-circuit, for example.

In this case, the tungsten film on the gate electrode grows both in the vertical direction and the lateral direction. Thus, the tungsten film on the gate electrode may short-circuit with the tungsten film that grows on the source and drain region. Consequently, it is difficult to unnecessarily increase the thickness of the tungsten film, thereby preventing the resistance of the gate electrode and the source and drain region from decreasing.

On the other hand, in the conventional SALICIDE process shown in FIG. 15, since the sidewall protrudes high from the polysilicon film of the gate electrode, even if the high temperature heat treatment is performed for accelerating the siliciding process, the silicide can be prevented from hanging down from the polysilicon film to the sidewall. Thus, the diffusion layer can be prevented from short-circuiting with the gate electrode.

However, in reality, it is difficult to cause the sidewall to highly protrude. This is because the silicon nitride film is formed on the polysilicon of the gate electrode and PSG or NSG is used for the sidewall as shown in FIG. 15E. The PSG or NSG has a low selective characteristic against thermal phosphoric acid. Thus, if the silicon nitride film is etched out with the thermal phosphoric acid, the sidewall composed of these materials is etched out, too. In particular, as transistors are miniaturized, sidewalls are also miniaturized. Thus, the film thickness at the top of a sidewall becomes thin. The sidewall is isotopically etched out when the silicon nitride film is over-etched. Consequently, a sidewall that can prevent the silicide from hanging down from the polysilicon of the gate portion cannot be formed.

SUMMARY OF THE INVENTION

Thus, an object of the present invention is to solve such a problem and to provide a semiconductor apparatus having a gate electrode and a source and drain region with low resistance and free from short-circuiting thereof.

Another object of the present invention is to provide a fabrication method of a semiconductor apparatus having a sidewall that can prevent each electrode (namely, a gate portion and an impurity diffusion layer) from short-circuiting with each other so as to decrease the resistance of each electrode portion.

A first aspect of the present invention is a semiconductor apparatus including a gate electrode, comprising a tungsten film that is individually deposited on a gate electrode and a source and drain region and that does not exceed the height of a sidewall of a side surface portion of the gate electrode.

A second aspect of the present invention is a fabrication method of a semiconductor apparatus that includes a gate electrode, comprising the steps of (a) depositing one of an amorphous silicon film and a polysilicon film on a semiconductor substrate, (b) depositing a film that is removable with a satisfactory selective ratio against a field oxide film and a material that composes a sidewall of a side surface portion of the gate electrode on one of the amorphous silicon film and the polysilicon film, (c) processing the films deposited in said steps (a) and (b) as the gate electrode, (d) forming the sidewall on the side surface portion of the gate electrode, (e) selectively removing the removable film so as to expose the front surface of one of the amorphous silicon film and the polysilicon film composing the gate electrode, (f) forming a source and drain region on the semiconductor substrate, and (g) depositing tungsten on both one of the amorphous silicon film and the polysilicon film and the source and drain region.

A polysilicon film is deposited on a semiconductor substrate. One of a PSG film, a BSG film, and a BPSG film that can be removed with an enough selective characteristic against a material that composes a field oxide film and a sidewall of a side surface portion of a gate electrode is deposited on the polysilicon film.

After the deposited film is formed as a gate electrode, the sidewall is formed at the side surface portion of the gate electrode side. One of the PSG film, the BSG film, and the BPSG film on the gate electrode is exposed to a fluoric acid anhydride vapor atmosphere on low pressure so as to selectively remove it. Thus, the front surface of the polysilicon film, which composes the gate electrode, is exposed.

Tungsten is deposited on the front surface of the polysilicon film and the source and drain region formed on the semiconductor substrate and then insulator film is formed thereon. Thereafter, a contact hole is formed in the insulator film so as to form a contact.

Thus, the tungsten film deposited on the gate electrode grows only in the vertical direction. Thus, when the tungsten film is structured so that it does not exceed the height of the sidewall of the side surface portion of the gate electrode, the gate electrode and the source and drain region with low resistances and free from short-circuiting can be formed.

A third aspect of the present invention is a fabrication method of a semiconductor apparatus, comprising the steps of (a) forming a gate electrode film on a semiconductor substrate and selectively forming a first insulator film that contains phosphorus on the gate electrode film, (b) forming a second insulator film that does not contain phosphorus on the resultant semiconductor substrate and etching out the second insulator film so as to form a sidewall insulator film on the gate electrode film and a side surface of the first insulator film, and (c) etching out the first insulator film with an etchant that contains fluoric acid.

According to the fabrication method of the semiconductor apparatus of the present invention, after a first insulator film that contains phosphorus is formed on a gate electrode film, a sidewall insulator film is formed of a second insulator film that does not contain phosphorus on the surface of the gate electrode film.

This is because the inventors of the present invention have discovered that an insulator that contains phosphorus (for example, PSG and BPSG, which is an oxide that contains phosphorus) can be selectively etched out with fluoric acid.

In other words, experiments conducted by the inventors of the present invention show and is confirmed the following results. A nitride film that is conventionally used as an insulator film of a semiconductor apparatus is not encroached with fluoric acid. In addition, without need to etch out a thermal silicon oxide film that insulates between a element and a element of the semiconductor apparatus as a field oxide film, PSG and BPSG that are insulators containing phosphorus can be selectively removed. Moreover, the etchant materials preferably contains fluoric acid (60% or more).

Thus, from the experimental results, it is clear that since fluoric acid reacts with phosphorus, the fluoric acid selectively reacts with an insulator that contains phosphorus. Thus, when a substance that contains phosphorus and another substance that does not contain phosphorus are etched out at the same time with the etchant materials that contains the fluoric acid, the substance that contains phosphorus can be selectively etched out.

Thus, when a first insulator film that contains phosphorus is formed on a gate electrode film, a sidewall insulator film composed of a second insulator film that does not contain phosphorus is formed on the side surface of the gate electrode film, and the resultant semiconductor substrate is etched out with an etchant that contains fluoric acid, only the first insulator film, which contains phosphorus, can be etched out without an influence of the sidewall insulator film. Thus, the sidewall that satisfactorily protrudes high from the gate electrode film is formed.

These and other objects, features and advantages of the present invention will become more apparent in light of the following detailed description of best mode embodiments thereof, as illustrated in the accompanying drawings.

BRIEF DESCRIPTION OF DRAWINGS

FIG. 3 is a graph showing measured results of sheet resistance values of a gate electrode corresponding to the first embodiment of the present invention;

FIG. 4 is a graph showing measured results of sheet resistance values of a source and drain region corresponding to the first embodiment of the present invention;

FIG. 8 is a graph showing experimental results of the relation between etched thicknesses of BPSG, PSG, and thermal oxide film and etching selective ratios of PSG/thermal oxide film;

FIG. 11 is a graph showing experimental results of sheet resistance values of a gate electrode portion of a semiconductor apparatus according to a fourth embodiment of the present invention;

DESCRIPTION OF PREFERRED EMBODIMENTS

Figure 1A:
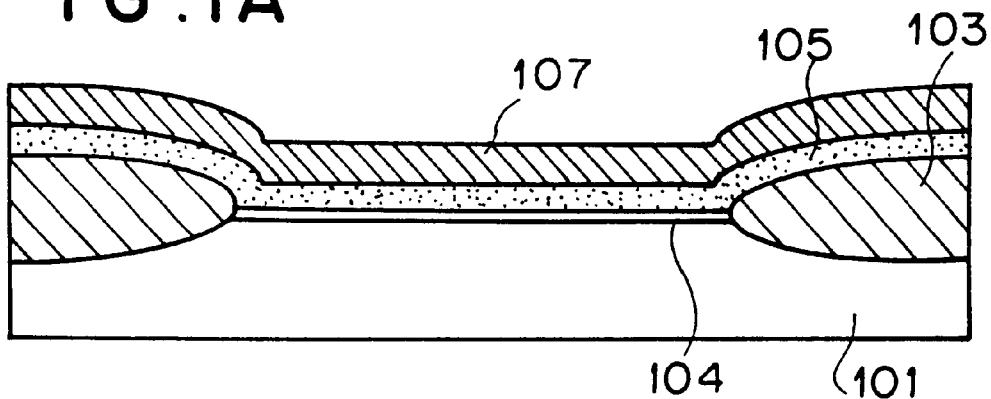
FIGS. 1A to 1D are sectional views showing fabrication steps of a semiconductor apparatus according to a embodiment of the present invention.
Figure 1B:
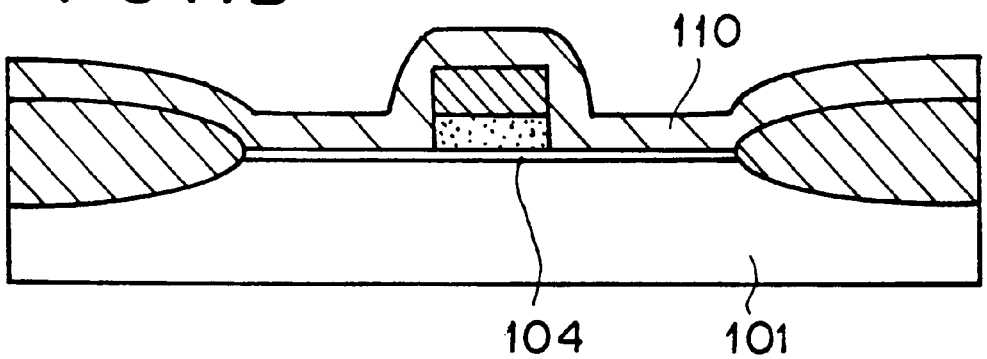
Figure 1C:
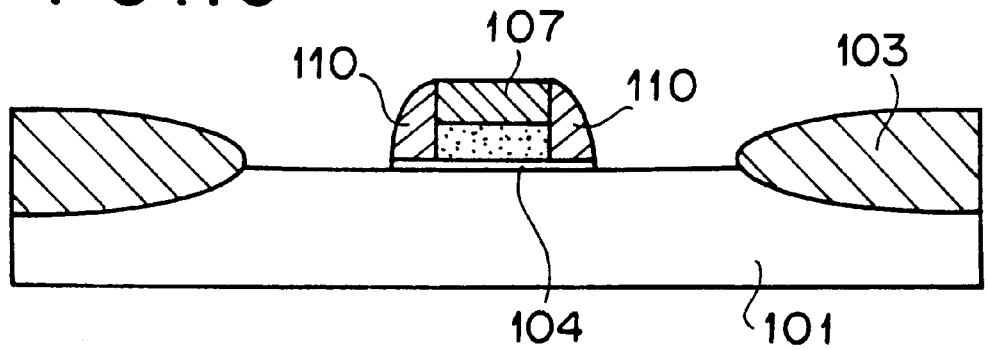
Figure 1D:
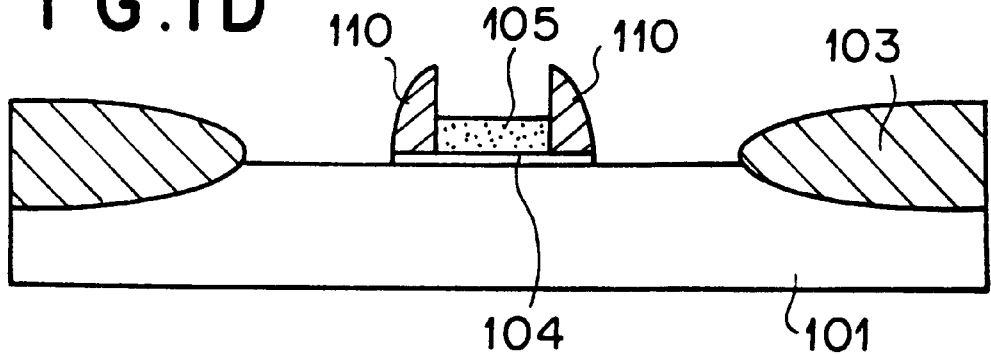

Next, with reference to the accompanying drawings, embodiments of the present invention will be described.

[First Embodiment]

FIGS. 1A to 1D are sectional views showing fabrication steps of a MOS transistor for forming a sidewall corresponding to a sidewall forming method and for forming corresponding to a application of a salicide technique according to a first embodiment of the present invention.

A field oxide film 103 with a thickness of around 400 nm is formed on a P type or N type semiconductor substrate 101 by a selectively oxidizing method. Thereafter, a gate oxide film 104 with a thickness of around 8 nm is formed in a transistor forming region surrounded by the field oxide film 103 by the thermal oxidizing method. Next, an amorphous silicon or polysilicon film 105 that is a conductor film with a thickness of around 200 nm and a PSG (Phospho-Silicate Glass) film 107 that is an insulator film containing phosphorus are successively formed on the entire surface of the resultant semiconductor substrate 101 by the atmospheric pressure CVD method (see FIG. 1A).

For forming a gate electrode, the front surface of the resultant semiconductor substrate is patterned by the photolithography method and then the PSG film 107 is etched out by the RIE (Reactive Ion Etching) method (that is an anisotropic etching method) or the like, and the polysilicon film 105 is also etched out by the RIE method or the like. The polysilicon film 105 and the PSG film 107 that are left by the patterning become members of the gate electrode. After that, a silicon nitride film 110 with a thickness of around 65 nm (which is an insulator film other than the above-described insulator film that contains phosphorus) is formed on the entire front surface of the resultant semiconductor substrate 101 by the CVD method so as to form a sidewall of the gate electrode. In this embodiment, the silicon nitride film 110 is formed under atmosphere of a condition of dichlorosilane gas ($SiH_2Cl_2$) and ammonia gas ($NH_3$) at a temperature of 750° C. at a pressure of 0.5 Torr (see FIG. 1B).

The silicon nitride film 110 is etched out by the RIE method (which is an anisotropic etching method) or the like until both the PSG film 107 on the gate electrode portion and the front surface of the resultant semiconductor substrate corresponding to the portion of the impurity region are exposed. Thereafter, the sidewall is formed after etching back (see FIG. 1C).

Thereafter, the PSG film 107 on the gate electrode portion is selectively etched out with an etchant that contains hydrofluoric acid (HF) in a chamber that can be deaerated from the resultant semiconductor substrate. In this embodiment, the etching process is performed in a hydrofluoric acid anhydride vapor atmosphere at a low pressure. The hydrofluoric acid anhydride vapor hardly erodes the silicon nitride film 110 in comparison with the PSG film 107. Thus, the gate electrode portion is dented for around 200 nm corresponding to the thickness of the PSG film (see FIG. 1D).

The fabrication steps shown in FIGS. 1A to 1D are most important features of the fabrication method of the semiconductor apparatus according to the present invention. By the fabrication method, the sidewall with as high as 200 nm can sufficiently be formed on the polysilicon film 105, a different way of saying, a groove of the gate electrode portion is formed with 200 nm deep in depth.

Figure 2A:
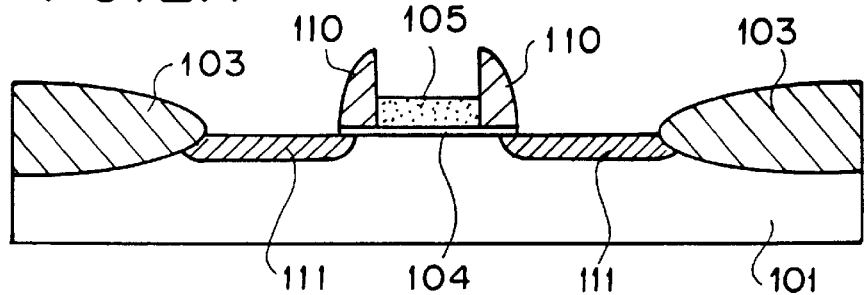
FIGS. 2A to 2D are sectional views showing fabrication steps of a semiconductor apparatus according to the first embodiment of the present invention.

Thereafter, the semiconductor substrate 1 is oxidized and thereby an oxide film is formed on the polysilicon film 105 which compose the gate electrode and the front surface of the active region. An ion implantation process and a heat treatment are performed for the polysilicon film 105 and the front surface of the active region on which the oxide film has been formed. Thus, the resistance of the gate electrode is decreased and a source and drain region 111 is formed in the active region (see FIG. 2A).

When the resistance of the gate electrode is decreased and the source and drain region 111 is formed in the active region, a native oxide film on the field oxide film 103, the polysilicon film 105 (which composes the gate electrode), and the source and drain region 111 are removed with fluoric acid or the like. A tungsten film 118 is selectively grown on the polysilicon film 105 (which is the gate electrode) and the front surface of the source and drain region 111 in the CVD equipment.

In this case, the temperature of the semiconductor substrate is increased to 300° C. After the chamber is deaerated, $WF_6$ of 20 sccm and Ar of 10 sccm are supplied to the chamber. $WF_6$ and silicon are reacted in the chamber at a pressure of 200 mTorr. Thus, with the following chemical reaction, the tungsten film 118 is formed on the front surface of the polysilicon film 105 (which composes the gate electrode) and of the source and drain region 111.

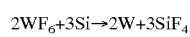

This chemical reaction is a substitution reaction. When the tungsten film 118 is formed, the silicon on the semiconductor substrate 101 is encroached. When the encroachment amount increases, the resultant semiconductor apparatus is adversely affected. To solve this problem, the chemical reaction is performed at a high partial pressure of $WF_6$ so as to be easy nucleation of the tungsten and to decrease the encroachment amount. In the first embodiment of the present invention, silicon is eroded for around 150Å by the chemical reaction for five seconds so as to form nucleation of the tungsten film 118.

Figure 2B:
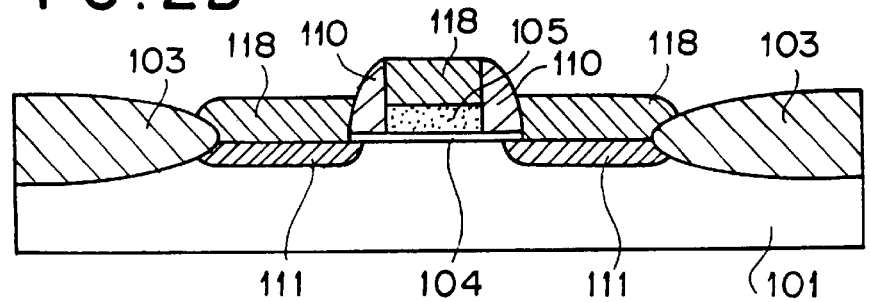

Thereafter, while the temperature of the semiconductor substrate in the same CVD equipment is kept constant, $WF_6$ of 10 sccm, $SiH_4$ of 6 sccm, and Ar of 50 sccm are supplied to the equipment and then $WF_6$ is reduced with $SiH_4$ at a pressure of 200 mTorr, the tungsten film 118 is selectively deposited on the front surface of only the polysilicon film 105 (which composes the gate electrode). At this point, the tungsten film 118 can be deposited for up to 2000Å (see FIG. 2B).

Thereafter, the resultant semiconductor substrate 1 is loaded into a multi-chamber type PECVD (Plasma-Enhanced Chemical Vapor Deposition) equipment. An oxide film 119 that is an inter-layer insulator film is deposited on the field oxide film 103, the sidewall 110, and the tungsten film 118 for around 100 nm by the plasma CVD method.

Thereafter, the resultant semiconductor substrate 101 is loaded in a vacuum into a high density plasma CVD reaction chamber such as an ECR (Electron Cyclotron Resonance) chamber. In the chamber, a SiON film 120 is deposited on the front surface of the resultant semiconductor substrate for around 3000 nm. Although a film deposited by the high density plasma CVD method has an excellent gap coating characteristic (namely, an excellent burring characteristic), it is difficult to decrease the gap due to the gate electrode and the like.

Figure 2C:
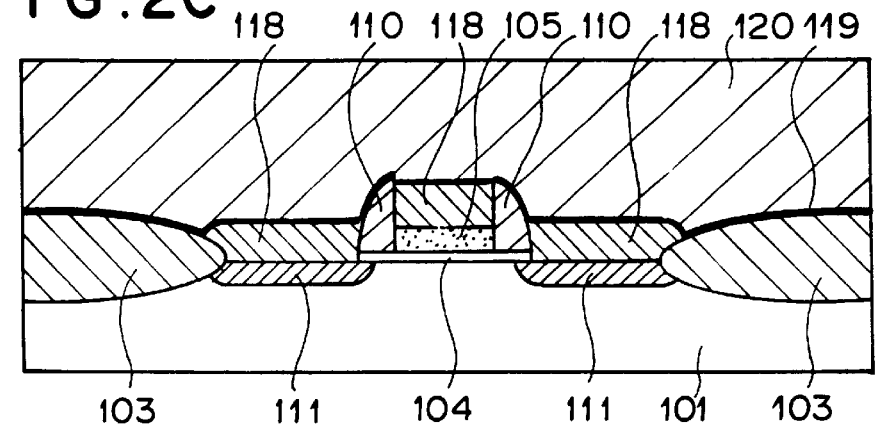

To solve this problem, the resultant semiconductor substrate 101 on which the SiON film 120 has been deposited is planarized by a CMP (Chemical Mechanical Polishing) equipment so as to remove the gap due to the gate electrode and the like. Thus, the front surface of the SiON film 120 (which composes the inter-layer insulator film of the semiconductor substrate 101) is planarized (see FIG. 2C). Thus, an insulator film with a thickness of 2500 nm (which is an inter-layer insulator film) is formed.

Openings of contact holes that reach the tungsten film 118 deposited on the gate electrode and the source and drain region 111 are formed in the planarized SiON film 120 by the lithography method and the etching method, which are known methods. In the structure according to the embodiment of the present invention, the tungsten film 118 has a high selective ratio against the insulator film (SiON film 120). Thus, when the openings of the contact holes are formed, the tungsten film 118 is hardly etched out. Consequently, the contact holes can be formed with a high reliability.

Figure 2D:
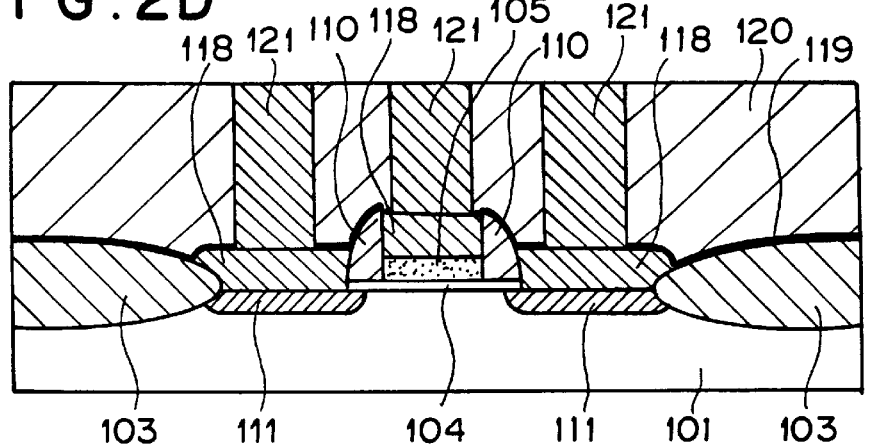

Metal members that are electrically connected with the wiring of the upper layer are buried in the open contact holes by for example a selective growing method of the tungsten film (see FIG. 2D).

In the structure according to the first embodiment of the present invention, the resistance of the contacts depends on the contacting resistance of the tungsten film 118 deposited on the gate electrode and the source and drain region 111 and the metal members buried in the contact holes and the resistance of the metal members themselves. Thus, the resistance of the contacts is very low.

According to the first embodiment of the present invention, the metal members are burred in the contact holes by the selective growth of the tungsten film 121. However, the same effect can be accomplished by using a non-selective grown of the tungsten film and/or using a material with a relatively lower resistance such as an aluminum alloy or a copper alloy, or the like.

FIG. 3 is a graph showing measured results of sheet resistance values of the gate electrode formed corresponding to the first embodiment of the present invention. FIG. 4 is a graph showing measured results of sheet resistance values of the source and drain region 111 formed corresponding to the first embodiment of the present invention.

In FIGS. 3 and 4, the sheet resistance values of the first embodiment of the present invention are compared with those of the related art reference of which the SALICIDE is formed of a titanium silicide film. In FIGS. 3 and 4, circles represent measured results according to the first embodiment of the present invention, whereas squares represent measured results corresponding to the related art reference. In addition, black circles and black squares represent measured results for N type semiconductor apparatuses, whereas white circles and white squares represent measured results for P type semiconductor apparatuses.

From these graphs, it is clear that the resistance values of the gate electrode and the source and drain region 111 are 2Ω/sq. that is relatively lower than that of the related art reference of which the SALICIDE is formed of the titanium silicide film. From the sheet resistance values, it is clear that the titanium silicide film is formed for around 500Å. Silicon on the substrate is consumed for around 450Å. On the other hand, since the tungsten film 118 is selectively grown for around 150Å, a low resistance value with a shallow junction can be accomplished.

Figures 5, 6:
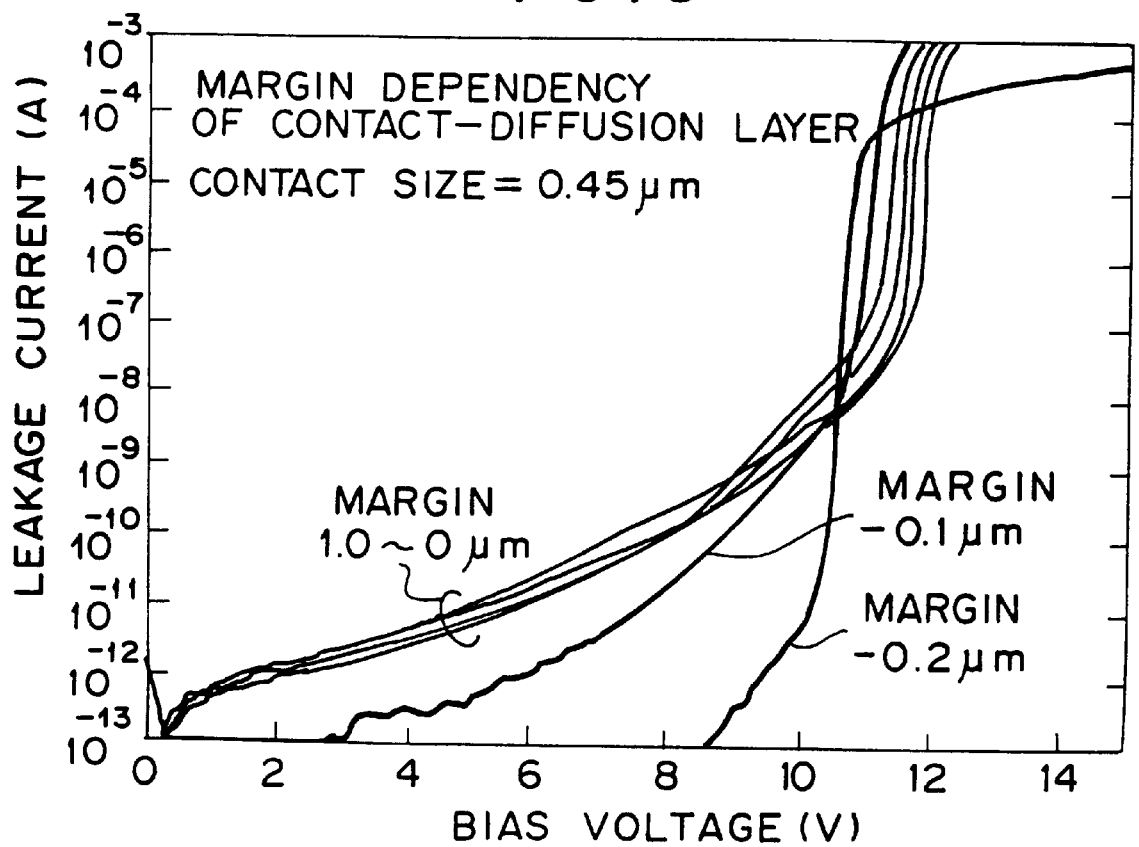
FIG. 5 is a list showing measured results of contact resistance values in the case that contact holes that reach a tungsten film deposited on the front surfaces of a gate electrode and a source and drain region are formed corresponding to the first embodiment of the present invention.
FIG. 6 is a graph showing experimental results of the relation between contact-field margin and junction leakage current in the case that contact holes that reach a tungsten film deposited on the front surfaces of a gate electrode and a source and drain region are formed corresponding to the first embodiment of the present invention.

FIG. 5 is a list showing measured results of contact resistance values in the case that contact holes that reach the tungsten film 118 deposited on the front surfaces of the gate electrode and the source and drain region 111 are formed corresponding to the first embodiment of the present invention.

In this case, as shown in FIG. 5, the resistance values of the contacts on an N type gate, a P type gate, an N+diffusion layer, and a P+diffusion layer are 1.8Ω, 2.5Ω, 2.3Ω, and 2.6Ω each per contact, respectively. Thus, it is clear that these resistance values are stable and are lower than 2.6Ω.

FIG. 6 is a graph showing the relation between the contact field margin and the junction leakage current in the case that the contact holes that reach the tungsten film 118 deposited on the front surfaces of the gate electrode and the source and drain region 111 are formed corresponding to the first embodiment of the present invention.

In the conventional structure of which the silicide is not formed on the source and drain region 111 or the resistance of the source and drain region 111 is decreased with the silicide or the like, if the margin between the field oxide film 103 and the contact holes is 0.2 μm, when the contact holes is formed, the silicide and the like are easily removed. Thus, the field oxide film 103 is partially removed and thereby the leakage current increases. On the other hand, in the structure according to the first embodiment of the present invention, even if the margin between the field oxide film 103 and the contact holes is 0 μm, an excellent junction leakage current characteristic can be accomplished.

Thus, when the tungsten film 118 is deposited on the polysilicon film 105, which composes the gate electrode, and the source and drain region 111 in such a manner that the tungsten film 118 does not exceed the height of the sidewall 110 of the side surface portion of the gate electrode, the gate electrode and the source and drain region 111 with low resistance values can be formed free from short-circuiting.

In the first embodiment of the present invention, the gate electrode is composed of the polysilicon film 105. However, it should be noted that the present invention can be applied for the case that the gate electrode is composed of an amorphous silicon film. Moreover, in the first embodiment, to dent the gate electrode, the PSG film 107 is used. However, the gate electrode can be dented using BSG (Boro-Silicate Glass), BPSG (Boro-Phospho-Silicate Glass), or the like.

According to the description of claims of the present invention, the present invention has the following aspects.

(1) An aspect of the present invention is a fabrication method of a semiconductor apparatus that includes a gate electrode, comprising the steps of (a) depositing one of an amorphous silicon film and a polysilicon film on a semiconductor substrate, (b) depositing a film that is removable with a satisfactory selective ratio against a field oxide film and a material that composes a sidewall of a side surface portion of the gate electrode on one of the amorphous silicon film and the polysilicon film, (c) processing the films deposited in said steps (a) and (b) as the gate electrode, (d) forming the sidewall on the side surface portion of the gate electrode, (e) selectively removing the removable film so as to expose the front surface of one of the amorphous silicon film and the polysilicon film composing the gate electrode, (f) forming a source and drain region on the semiconductor substrate, (g) depositing tungsten on both one of the amorphous silicon film that composes the gate electrode and the polysilicon film and the source and drain region, and (h) forming an insulator film on the deposited tungsten, the field oxide film, and the sidewall.

(2). Another aspect of the present invention is a fabrication method of a semiconductor apparatus that includes a gate electrode, comprising the steps of (a) depositing one of an amorphous silicon film and a polysilicon film on a semiconductor substrate, (b) depositing one of a PSG film, a BSG film, and a BPSG film that is removable with a satisfactory selective ratio against a field oxide film and a material that composes a sidewall of a side surface portion of the gate electrode on one of the amorphous silicon film and the polysilicon film, (c) processing the films deposited in said steps (a) and (b) as the gate electrode, (d) forming the sidewall on the side surface portion of the gate electrode, (e) exposing one of the PSG film, the BSG film, and the BPSG film to fluoric acid anhydride vapor at a low pressure and selectively removing the removable film so as to expose the front surface of one of the amorphous silicon film and the polysilicon film composing the gate electrode, (f) forming a source and drain region on the semiconductor substrate, (g) depositing tungsten on both one of the amorphous silicon film and the polysilicon film and the source and drain region, and (h) forming an insulator film on the deposited tungsten, the field oxide film, and the sidewall.

(3) A further aspect of the present invention is a fabrication method of a semiconductor apparatus that includes a gate electrode, comprising the steps of (a) depositing one of an amorphous silicon film and a polysilicon film on a semiconductor substrate, (b) depositing a film that is removable with a satisfactory selective ratio against a field oxide film and a material that composes a sidewall of a side surface portion of the gate electrode on one of the amorphous silicon film and the polysilicon film, (c) processing the films deposited in said steps (a) and (b) as the gate electrode, (d) forming the sidewall on the side surface portion of the gate electrode, (e) selectively removing the removable film so as to expose the front surface of one of the amorphous silicon film and the polysilicon film composing the gate electrode, (f) forming a source and drain region on the semiconductor substrate, (g) depositing tungsten on both one of the amorphous silicon film and the polysilicon film and the source and drain region, (h) forming an insulator film on the deposited tungsten, the field oxide film, and the sidewall, and (i) forming contact holes in the insulation film so as to form contacts.

(4) A more further aspect of the present invention is a fabrication method of a semiconductor apparatus that includes a gate electrode, comprising the steps of (a) depositing one of an amorphous silicon film and a polysilicon film on a semiconductor substrate, (b) depositing one of a PSG film, a BSG film, and a BPSG film that is removable with a satisfactory selective ratio against a field oxide film and a material that composes a sidewall of a side surface portion of the gate electrode on one of the amorphous silicon film and the polysilicon film, (c) processing the films deposited in said steps (a) and (b) as the gate electrode, (d) forming the sidewall on the side surface portion of the gate electrode, (e) exposing one of the PSG film, the BSG film, and the BPSG film to fluoric acid anhydride at a reduced pressure and selectively removing the removable film so as to expose the front surface of one of the amorphous silicon film and the polysilicon film composing the gate electrode, (f) forming a source and drain region on the semiconductor substrate, (g) depositing tungsten on both one of the amorphous silicon film and the polysilicon film and the source and drain region, (h) forming an insulator film on the deposited tungsten, the field oxide film, and the sidewall, and (i) forming contact holes in the insulation film so as to form contacts.

As described above, according to the first embodiment of the present invention, the tungsten film is deposited on the gate electrode, the source and drain region in such a manner that the tungsten film does not exceed the height of the sidewall of the side surface portion of the gate electrode. Thus, the gate electrode and the source and drain region can be formed with low resistance values and free from short-circuiting.

[Second Embodiment]

A second embodiment of the present invention is a fabrication method of a semiconductor apparatus. The first half of the fabrication steps of the second embodiment is the same as the first half of the fabrication steps of the first embodiment (see FIGS. 1A to 1D).

Photoresist is deposited on an impurity region into which impurity ions are implanted by the photolithography method. Corresponding to the conduction type of the semiconductor substrate 101, positive conduction type ions or negative conduction type ions are implanted. In other words, when the semiconductor substrate 101 is of the P type, BF2 ions are implanted into the semiconductor substrate 101 with an implantation energy of 70 keV and an implantation amount of $1 \times 10^{15}/cm^2$. When the semiconductor substrate 101 is of the N type, As ions are implanted into the semiconductor substrate 101 with an implantation energy of 100 keV and an implantation amount of $1 \times 10^{15}/cm^2$. After the photoresist is removed, an impurity region 111 is formed by an activating heat treatment in a nitrogen atmosphere at a temperature of 100° C. for 10 minutes (see FIG. 7A).

A native oxide film formed on the front surfaces of the impurity region 111 and the polysilicon film 105 are removed with for example a fluoric acid solution. A titanium (Ti) film, which is a conductor film, is deposited on the entire surface of the resultant semiconductor substrate 101 for around 30 nm by the spatter method. A heat treatment is performed for the resultant semiconductor substrate 101, for example, in a nitrogen atmosphere by the RTA (Rapid Thermal Annealing) method using a halogen lamp at a temperature of 700° C. for 30 seconds. Thus, a titanium silicide film (TiSi$_2$) 114 with a thickness of 50 nm is formed on the polysilicon film 105 and the impurity region 111. At this point, since the silicon nitride film 110 and the field oxide film 103 do not contain silicon (Si) which reacts with titanium for forming a silicide, titanium silicide is not formed thereon. The silicon nitride film 110 and the field oxide film 103 react with nitrogen of the atmospheric gas and thereby a titanium nitride (TiN) film 115 is formed (see FIG. 7B).

Thereafter, the resultant semiconductor substrate is wetetched with a mixture of ammonia and a hydrogen peroxide solution so as to selectively remove only the titanium nitride film 115. Thereafter, a heat treatment such as the RTA method is performed for the resultant semiconductor substrate (in a nitrogen atmosphere at a temperature of 850° C. for 10 seconds). Thus, the titanium silicide film 114 is dislocated to the layer, thereby decreasing the resistance values of the electrode portions. Thereafter, as with the related art reference, an inter-layer insulator film 116 composed of BPSG or the like is formed on the semiconductor substrate 101. Next, contact holes are formed and lead wires composed of aluminum (Al) or copper (Cu) are formed. Thus, the fabrication of a semiconductor apparatus is completed (see FIG. 7C).

In the second embodiment, as an etchant, fluoric acid anhydride is used. However, another etchant that contains a predetermined amount of fluoric acid can be used instead of fluoric acid anhydride vapor as is clear from FIG. 8.

FIG. 8 is a graph showing experimental results of the relation between the thickness of the BPSG (Boro-Phospho-Silicate Glass), PSG (which is an oxide that contains phosphorus), and thermal silicon oxide film that have been etched out and the etching selective ratio of PSG and thermal oxide film. The etchant is composed by varying the mixing ratio of hydrofluoric acid (at constant of 600 Pa (Pascal)) and water (H$_2$O). In FIG. 8, the lateral axis represents the pressure of the water. The etching time was 30 seconds. In the experimental data, the ratio of the partial pressure of fluoric acid and the partial pressure of water represents the mixing ratio of the etchant. In addition to the data of the etchant that contains phosphorus, data of a silicon thermal oxide film used as a field oxide film or the like for a semiconductor apparatus is listed so that the mixing ratio of an etchant that can selectively remove a substance that contains phosphorus without affecting other portions can be selected.

From FIG. 8 showing the relation between the water pressure (H$_2$O pressure) and the etching ration of PSG/ thermal oxide film, it is clear that the water pressure remarkably varies when the water pressure is in the range from 300 to 400 Pa. Thus, when the water pressure exceeds this range, as with PSG, the thermal silicon oxide film can be also etched out.

Since the etching ratio of PSG is almost the same as that of BPSG, when fluoric acid reacts with phosphorus of a substance that contains phosphorus, the substance is etched out. Thus, the same result takes place in other substances that contain phosphorus as well as PSG.

Thus, from the above-described result, when a substance that contains phosphorus is selectively etched out, since the ratio of fluoric acid contained in the etchant is obtained from the following expression, it is preferable that the etchant should contain fluoric acid for 60% or more.

$$\{(600 \text{ (Pa)})/(600 \text{ (Pa)}+400 \text{ (Pa)})\} \times 100 = 60(\%)$$

In the second embodiment, titanium (Ti) is used as a high melting point metal. However, another silicide that contains for example zirconium (Zr) can be used if the resistance of the silicide is lower than that of the metal itself. In addition, as a film that is selectively removed with fluoric acid anhydride, PSG film is used. However, since a material that contains phosphorus can be used as this film, BPSG (Boro-phospho-silicate Glass) can be used.

In the second embodiment, as the sidewall, a silicon nitride film is used. However, another insulator film such as a silicon oxide film that does not contain phosphorus can be used.

In the second embodiment, to prevent the front surface of the titanium film from being oxidized and nitrided when the titanium film is deposited and lamp-annealed in a nitrogen atmosphere, after the titanium film is deposited, tungsten (W), cobalt (Co), tungsten nitride (WNx), titanium nitride (TiN), titanium tungsten alloy (Ti-W), cobalt titanium alloy (Co-Ti), or the like can be deposited as a multilayer structure.

As described above, in the semiconductor apparatus fabricated according to the second embodiment, the sidewall of the side surface portion of the gate electrode is composed of silicon nitride or the like and is satisfactorily higher than the gate electrode. Thus, the heat treatment at a high temperature of around 850° C. can be performed for the resultant semiconductor substrate. Consequently, the silicidation of the impurity region is activated. Furthermore, since the titanium silicide that does not exceed the height of the sidewall is formed in the gate electrode portion, the gate electrode prevents the impurity region from short-circuiting.

However, in this method, when the impurity region is silicided, silicon in the impurity region is eroded. Thus, in the conventional structure of which a semiconductor apparatus that is miniaturized and thereby the impurity region thereof is shallowly formed, if the impurity region is excessively silicided for decreasing the resistance thereof, the impurity region will be lost. Thus, the thickness of the silicide may not be satisfactorily increased.

Next, fabrication methods according to third and fourth embodiments of the present invention will be described. In these embodiments, the feature of the sidewall of the second embodiment is provided. In addition, silicon in the impurity region is lesser eroded than that of the siliciding method. Moreover, the resistance values of electrode portions are decreased.

[Third Embodiment]

Firstly, the third embodiment of the present invention will be described. Since the fabrication steps for the sidewall in the third embodiment are the same as those of the first embodiments (see FIGS. 1A to 1D and 7A), their description will be omitted.

Figure 7A:
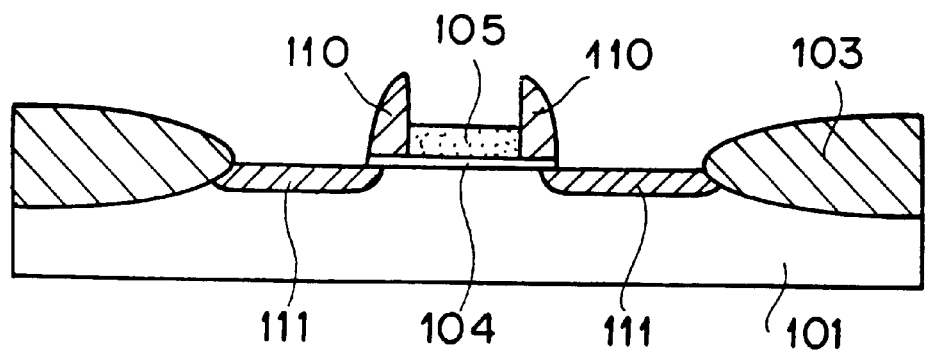
FIGS. 7A to 7C are sectional views showing fabrication steps of a semiconductor apparatus according to a second embodiment of the present invention.
Figure 7B:
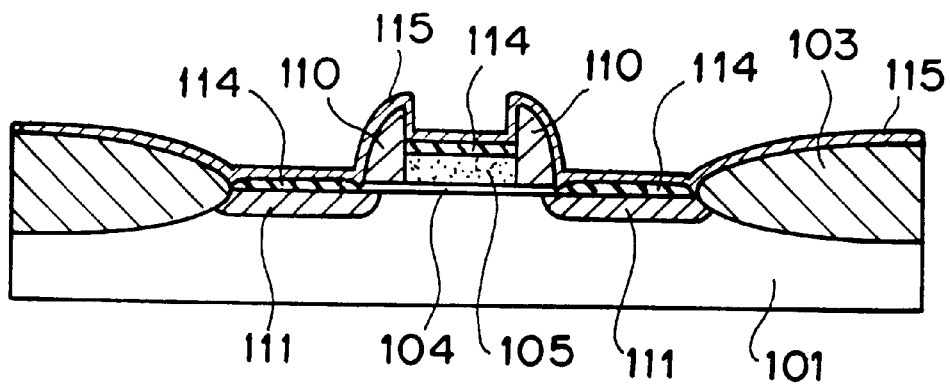
Figure 7C:
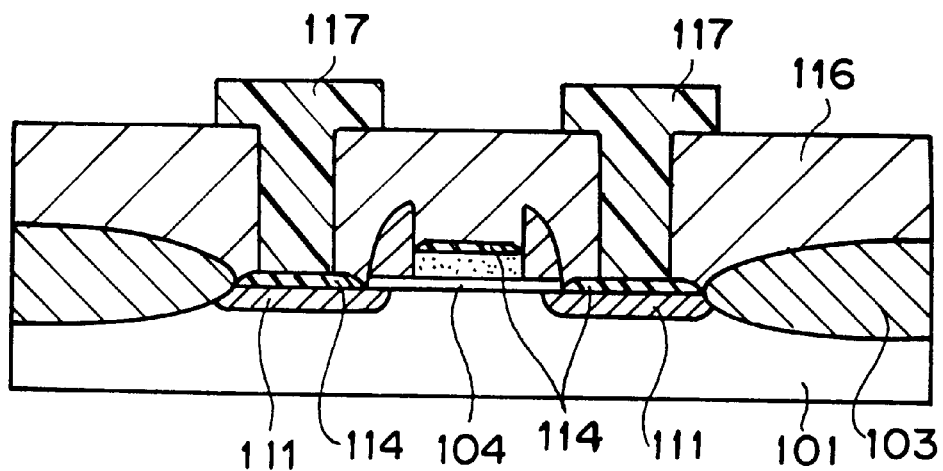
Figure 9A:
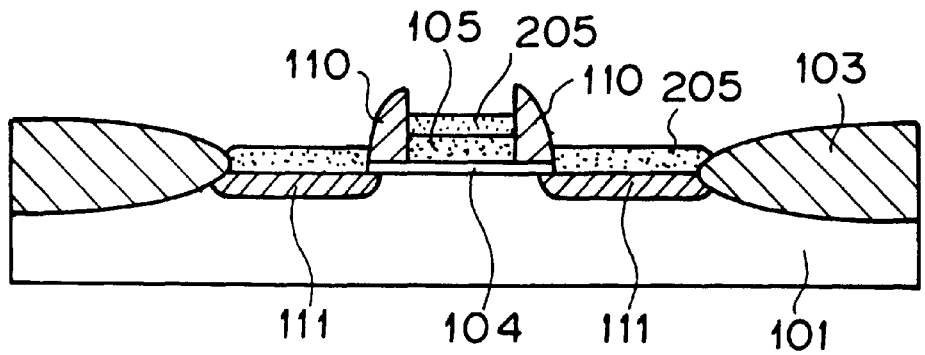
FIGS. 9A to 9C are sectional views showing fabrication steps of a semiconductor apparatus according to a third embodiment of the present invention.

After the step shown in FIG. 7A, a native oxide film formed on the individual electrode portions are removed with a fluoric acid solution or the like. Thereafter, the resultant semiconductor substrate is loaded into the CVD equipment. Next, monocrystal silicon, amorphous silicon, or polysilicon 205 with a thickness of around 80 nm is selectively formed on exposed portions of silicon (namely, on the polysilicon 105 and the impurity region 111) at a substrate temperature of 600° C. in an atmosphere of dichlorosilane (SiCl$_2$H$_2$) gas and hydrogen chloride (HCl) gas (see FIG. 9A).

Figure 9B:
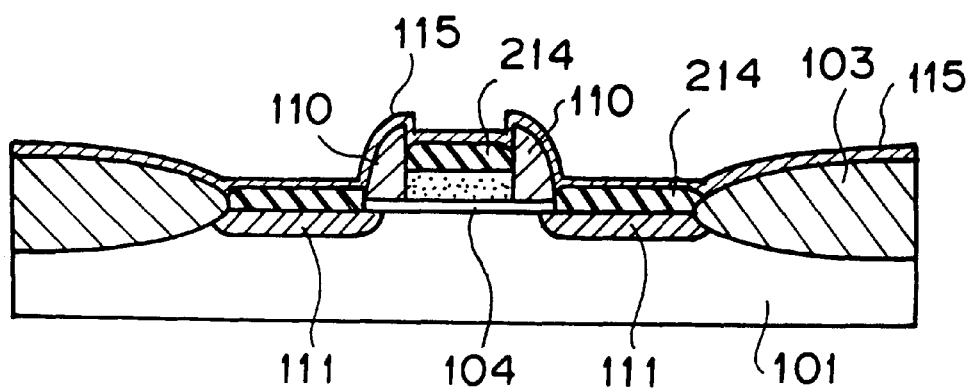

Next, a titanium (Ti) film is deposited on the entire surface of the resultant semiconductor substrate 101 for around 30 nm by the spatter method or the like. A heat treatment is performed for the resultant semiconductor substrate 101 in for example a nitrogen atmosphere by the RTA method using a halogen lamp at a temperature of 700° C. for 30 seconds. Thus, a titanium silicide film 214 with a thickness of 50 nm is formed on the polysilicon film 205 and the impurity region 111. At this point, since the silicon nitride film 110 and the field oxide film 103 do not contain silicon (Si) which reacts with titanium for forming a silicide, titanium silicide is not formed. The silicon nitride film 110 and the field oxide film 103 react with nitrogen of the atmospheric gas and thereby a titanium nitride film 115 is formed (see FIG. 9B).

Figure 9C:
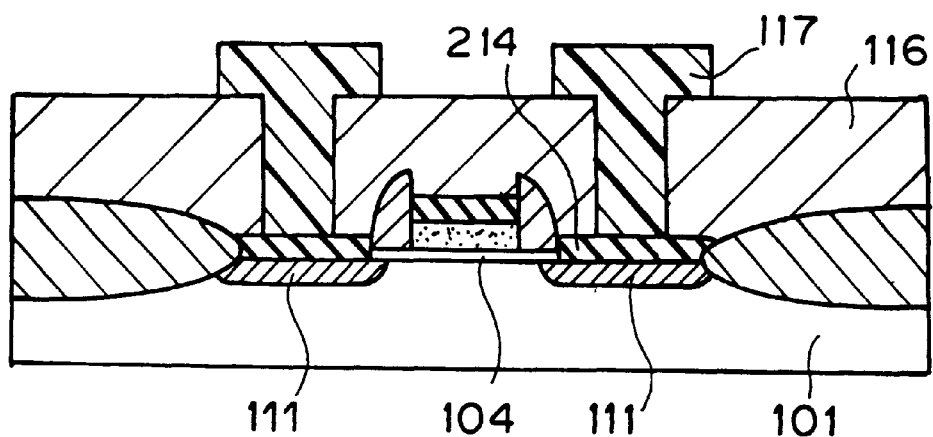

Thereafter, the resultant semiconductor substrate is wetetched with a mixture of ammonia and a hydrogen peroxide solution so as to selectively remove only the titanium nitride film 115. Thereafter, a heat treatment such as the RTA method is performed for the resultant semiconductor substrate (in a nitrogen atmosphere at a temperature of 850° C. for 10 seconds). Thus, the titanium silicide film 114 is dislocated to the layer, thereby decreasing the resistance values of the electrode portions. Thereafter, as with the related art reference, an inter-layer insulator film 116 composed of BPSG or the like is formed on the resultant semiconductor substrate 101. Next, contact holes are formed and lead wires composed of aluminum (Al) or copper (Cu) are formed. Thus, the fabrication of a semiconductor apparatus is completed (see FIG. 9C).

In the semiconductor apparatus according to the third embodiment, as with the second embodiment, since the sidewall has an enough height, even if the resultant semiconductor substrate is silicided, the impurity region do not short-circuit with the gate electrode portion. In addition, since the polysilicon 205 or the like necessary for the silicidation is formed on the impurity region 11, a silicide can be obtained without eroding the impurity region 111. Thus, even if the impurity region of the semiconductor apparatus is shallow, by adjusting the thickness of the polysilicon 205 or the like and operating selectively the condition of the RTA method, the resistance of the impurity region can be reduced.

[Forth Embodiment]

Next, the fourth embodiment will be described. In this embodiment, the silicidation process is not performed. In other words, when titanium used in the above-described embodiments is formed, silicide of the resistance thereof is decreased. However, when the resistance of a metal that is not formed silicide is lower than the resistance of the metal that is formed silicide, such a problem does not arise. Thus, a metal that satisfies such a condition is used.

Since the fabrication steps for forming the sidewall corresponding to the third embodiment are the same as those of the first embodiment (see FIGS. 1A to iD and FIG. 7A), their description will be omitted.

Figure 10A:
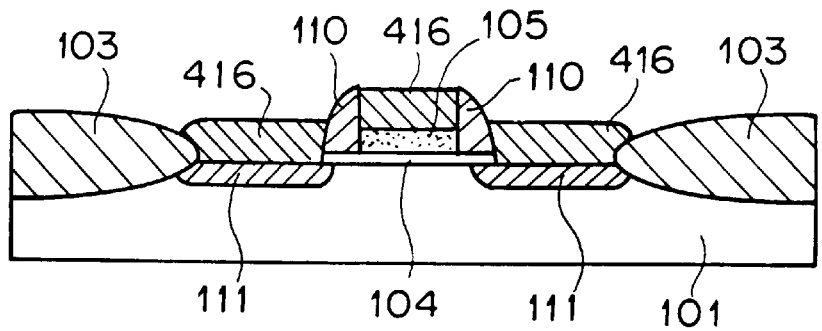
FIGS. 10A to 10C are sectional views showing fabrication steps of a semiconductor apparatus according to a fourth embodiment of the present invention.

After the fabrication step shown in FIG. 7A, a native oxide film formed on each electrode portion is removed with fluoric acid or the like. The resultant semiconductor substrate is loaded into the CVD equipment. Tungsten 416 is selectively grown on each electrode portion in the CVD equipment (see FIG. 10A).

In this case, the temperature of the semiconductor substrate is increased to 300° C. After the chamber is deaerated, tungsten fluoride ($WF_6$) of 20 sccm and argon (Ar) of 10 sccm are supplied to the chamber. $WF_6$ and silicon are reacted in the chamber at a pressure of 200 mTorr. Thus, with the following chemical reaction, cores of a tungsten film are formed on the polysilicon film 105 (which composes the gate electrode) and the front surface of the source and drain region 111.

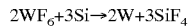

$$2WF_6 + 3Si \rightarrow 2W + 3SiF_4$$

This chemical reaction is a substitution reaction. When the tungsten film 416 is formed, the silicon on the semiconductor substrate 101 is encroached. When the encroachment amount increases, the resultant semiconductor apparatus is adversely affected. To solve this problem, the chemical reaction is performed at a high partial pressure of $WF_6$ so as to decrease the encroachment amount. In the first embodiment of the present invention, silicon is eroded for around 150Å by the chemical reaction for five seconds so as to form the nucleation of the tungsten film 416. When the cores are formed, the silicon is not further encroached.

Figure 10B:
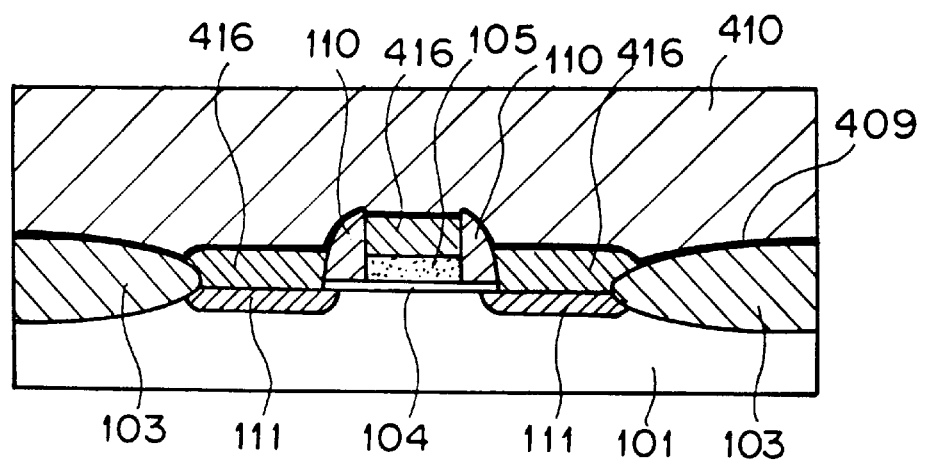

Thereafter, while the temperature of the semiconductor substrate in the equipment is kept constant, $WF_6$ of 10 sccm, $SiH_4$ of 6 sccm, and Ar of 50 sccm are supplied to the equipment and then $WF_6$ is reduced with $SiH_4$ at a pressure of 200 mTorr, the tungsten film 416 can be deposited for up to 2000Å (see FIG. 10B).

Thereafter, the resultant semiconductor substrate 101 is loaded into a multi-chamber type PECVD (Photo-Excited Chemical Vapor Deposition) equipment. An oxide film 409 that is an inter-layer insulator film is deposited on the field oxide film 103, the sidewall 110, and the tungsten film 416 for around 100 nm by the plasma CVD method.

Thereafter, the resultant semiconductor substrate 101 in a vacuum is loaded into a high density plasma CVD reaction chamber such as an ECR (Electron Cyclotron Resonance) chamber. In the chamber, a SiON film 410 that is an inter-layer insulator film is deposited on the front surface of the resultant semiconductor substrate for around 3000 nm. Although a film deposited by the high density plasma CVD method has an excellent gap coating characteristic (namely, an excellent burring characteristic), it is difficult to decrease the gap due to the gate electrode and the like.

To solve this problem, the resultant semiconductor substrate 101 on which the SiON film 410 has been deposited is planarized by a CMP (Chemical Mechanical Polishing) equipment so as to remove the gap due to the gate electrode and the like. Thus, the front surface of the SiON film 410 (which composes the inter-layer insulator film of the semiconductor substrate 101) is planarized. Thus, an insulator film with a thickness of 2500 nm (which is an inter-layer insulator film) is formed (see FIG. 10B).

Contact holes that reach the tungsten film 416 deposited on the gate electrode and the source and drain region 111 are formed on the planarized SiON film 410 by the lithography method and the etching method, which are known methods. In the structure according to the fourth embodiment of the present invention, the tungsten film 416 has a high selective ratio against the insulator film (SiON film 410). Thus, when the contact holes are formed, the tungsten film 416 is hardly etched out. Consequently, the contact holes can be formed with a high reliability.

Figure 10C:
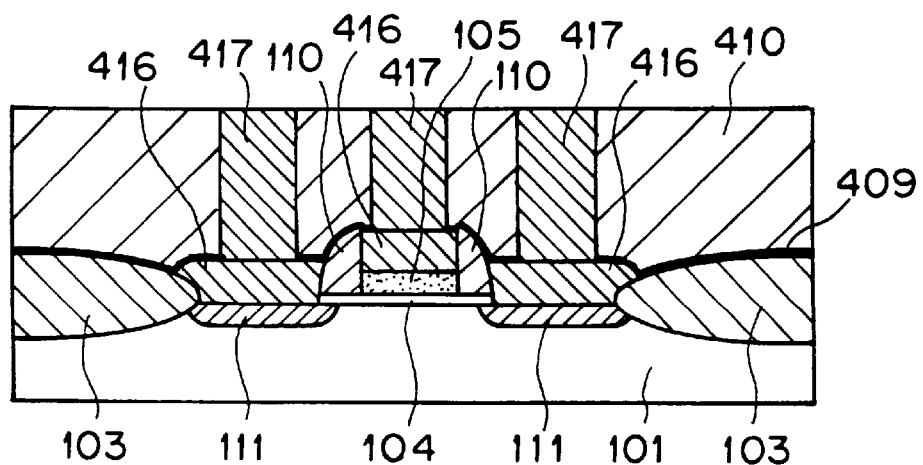

Metal members that are electrically connected with the wiring of the upper layer are buried in the open contact holes by for example a selective growing method of the tungsten film (see FIG. 10C).

In the semiconductor apparatus according to the fourth embodiment, as with the second embodiment, since the sidewall has an enough height, even if the tungsten film is selectively grown, the gate electrode does not short-circuit with the impurity region. In addition, since the tungsten film 416 is not silicided, even if the impurity region of the semiconductor apparatus is shallow, the resistance of the impurity region can be decreased without adversely affecting the impurity region.

In this embodiment, tungsten is used as a metal that causes the resistance of each electrode portion to decrease. However, another metal that has a low resistance such as cobalt (Co), nickel (Ni), molybdenum (Mo), tantalum (Ta), hafnium (Hf), platinum (Pt), or the like can be used. When a heat treatment such as the RTA method is performed for such a metal, it reacts with silicon of the electrode portion and thereby a silicide is formed. However, in this embodiment, since the heat treatment is not performed, the silicide is not formed. Thus, the impurity region is not lost. However, corresponding to the necessity and application, these metals can form a silicide.

Figure 12:
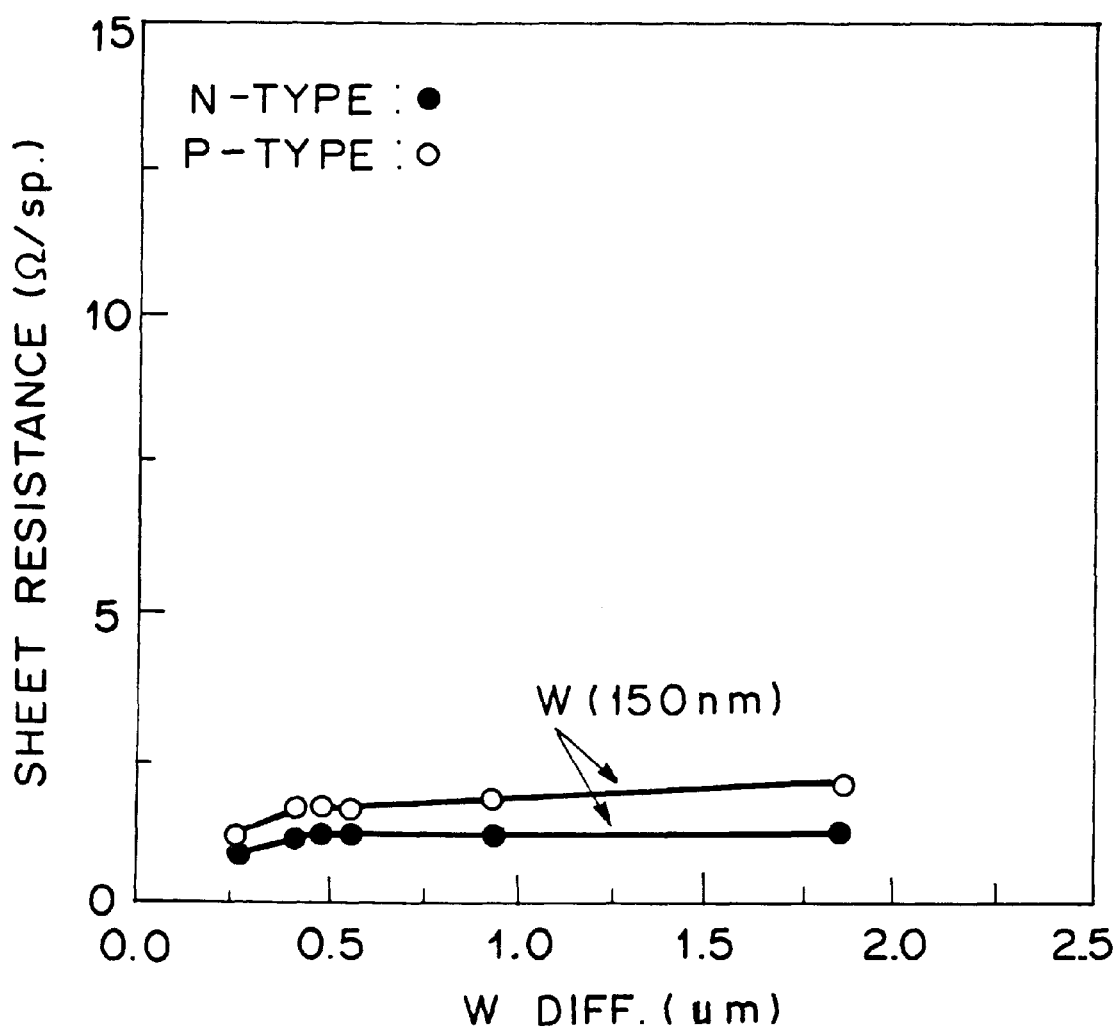
FIG. 12 is a graph showing experimental results of sheet resistance values of source and drain electrode portions of the semiconductor apparatus according to the fourth embodiment of the present invention.
Figure 13A:
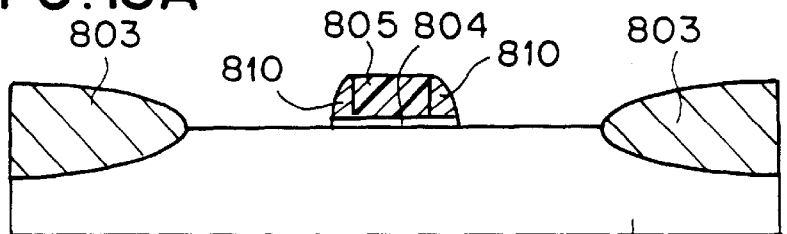
FIGS. 13A to 13D are sectional views showing fabrication steps of a conventional semiconductor apparatus.
Figure 13B:
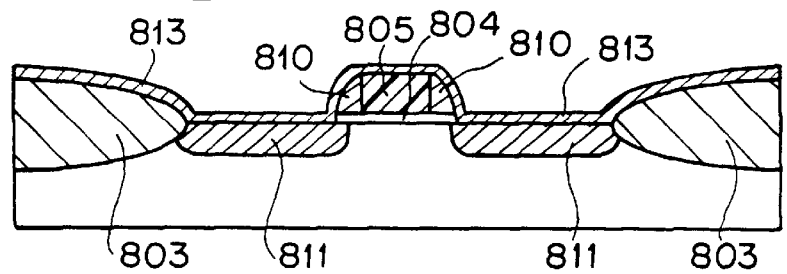
Figure 13C:
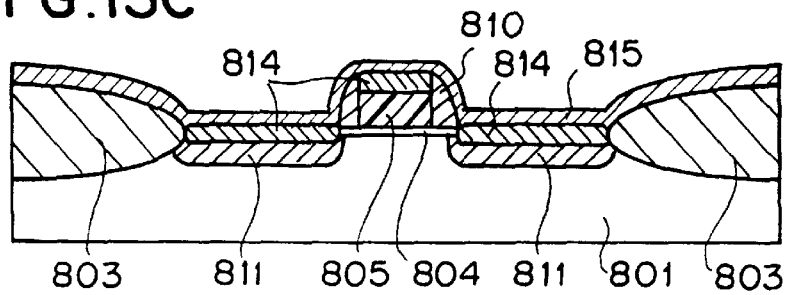
Figure 13D:
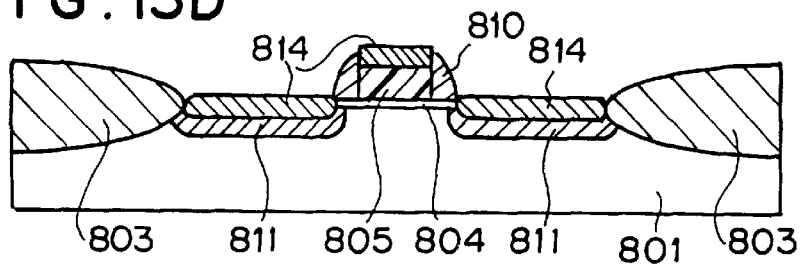
Figure 14:
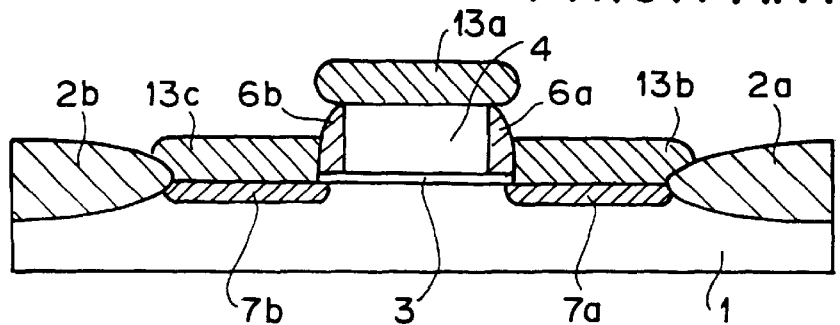
FIG. 14 is a sectional view showing the structure of a conventional semiconductor apparatus.
Figure 15A:
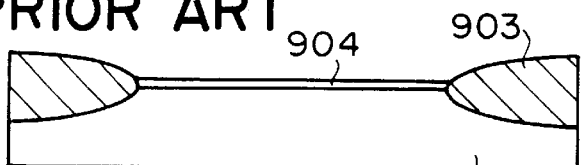
FIGS. 15A to 15H are sectional views showing fabrication steps of a conventional semiconductor apparatus.
Figure 15B:
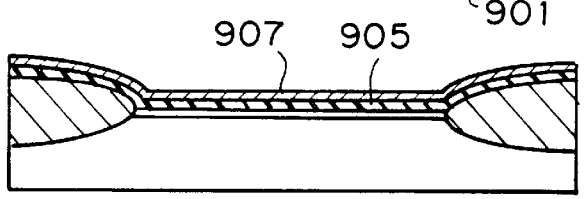
Figure 15C:
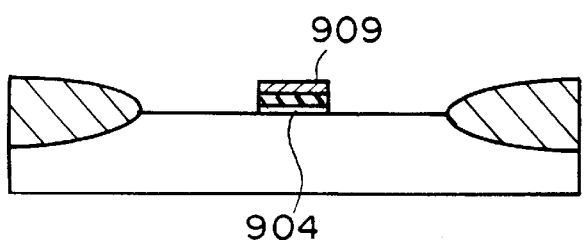
Figure 15D:
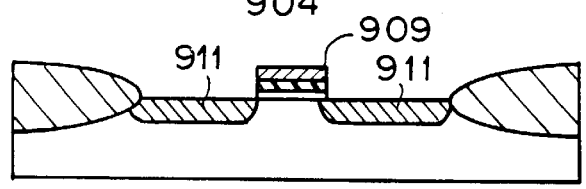
Figure 15E:
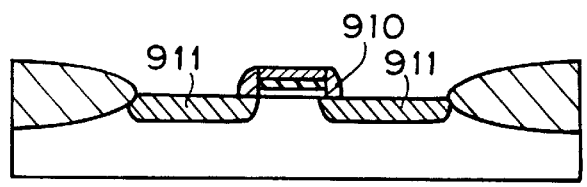
Figure 15F:
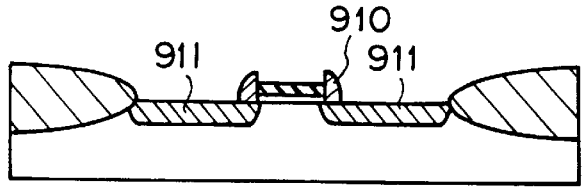
Figure 15G:
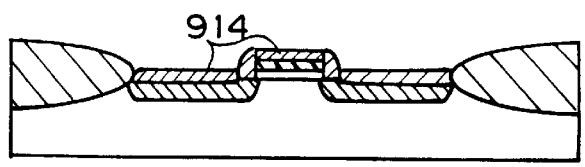
Figure 15H:
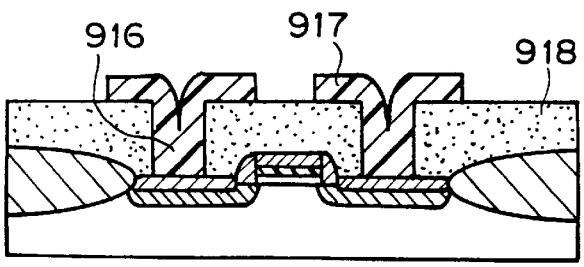

FIGS. 11 and 12 are graphs showing resistance values of electrode portions of the semiconductor apparatus according to the fourth embodiment. FIG. 11 shows the sheet resistance values of the gate electrode portion. FIG. 12 shows the sheet resistance values of the impurity region (source and drain region). In these graphs, the thickness of the tungsten film (W) is 150 nm. In the graphs, black circles represent experimental results of an N type semiconductor substrate, whereas white circles represent experimental results of an P type semiconductor substrate.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A fabrication method of a semiconductor device that includes a gate electrode, comprising the steps of:
   (a) depositing one of an amorphous silicon film and a polysilicon film on a semiconductor substrate;
   (b) depositing a film that is removable with a selected ratio to a field oxide film and a material that comprises a sidewall of a side surface portion of the gate electrode on one of the amorphous silicon film and the polysilicon film;
   (c) processing the films deposited in said steps (a) and (b) as the gate electrode;
   (d) forming the sidewall on the side surface portion of the gate electrode;
   (e) selectively removing the removable film so as to expose the front surface of one of the amorphous silicon film and the polysilicon film comprising the gate electrode;
   (f) forming a source and drain region on the semiconductor substrate;
   (g) depositing a tungsten film to a height not-exceeding the sidewall on one of the amorphous silicon film and the polysilicon film and on both the source and drain regions;
   (h) forming an oxide film that is an inter-layer insulator film on the field oxide film, the sidewall, and the tungsten film without forming tungsten-silicide;
   (i) forming openings of contact holes in the oxide film by a lithography method and an etching method; and
   (j) burying metal members in the openings of the contact holes.

2. The fabrication method as set forth in claim 1, wherein the removable film comprises one of the following:
   a PSG film, a BSG film and a BPSG film; and
   wherein the removable film is exposed to fluoric acid anhydride vapor in a low pressure.

3. A fabrication method of a semiconductor device, comprising the steps of:
   (a) forming a gate electrode film on a semiconductor substrate and selectively forming a first insulator film that contains phosphorus on the gate electrode film;
   (b) forming a second insulator film that does not contain phosphorus on the resultant semiconductor substrate and etching out the second insulator film so as to form a sidewall insulator film on a side surface of the gate electrode film and of the first insulator film;
   (c) etching out the first insulator film with an etchant that contains fluoric acid;
   (d) depositing a tungsten film as a gate electrode inside the sidewall insulator film to a height not-exceeding the sidewall insulator film;
   (e) forming an oxide film that is an inter-layer insulator film on the sidewall insulator film and the tungsten film without forming tungsten-silicide;
   (f) forming openings of contact holes in the oxide film by a lithography method and an etching method; and
   (g) burying metal members in the openings of the contact holes to form a resultant semiconductor substrate.

4. The fabrication method as set forth in claim 3, further comprising the steps of:
   (a) implanting impurities into the resultant semiconductor substrate of step (b) with a mask of the first insulator film so as to form a source and drain region on the resultant semiconductor substrate; and
   (b) selectively forming a conductor film on the gate electrode and the source and drain regions.

5. fabrication method of a semiconductor device, comprising the steps of:
   (a) successively forming a first conductor film and a first insulator film that contains phosphorous on a semiconductor substrate;
   (b) successively etching out unnecessary portions of the first insulator film and the first conductor film so as to form a gate electrode portion comprising the first conductor film and the first insulator film;
   (c) forming a second insulator film on the resultant semiconductor substrate;
   (d) etching out the second insulator film until the first insulator film on the gate electrode portion is exposed so as to form a sidewall on a side surface of the gate electrode portion;
   (e) selectively removing the first insulator film with an etchant that contains at least fluoric acid;
   (f) implanting impurities in the resultant semiconductor substrate of step (e) so as to form a source and drain region;
   (g) selectively forming a second conductor film of titanium on the gate electrode and the source and drain regions; and
   (h) siliciding the second conductor film so as to form a titanium-silicide film without forming the titanium silicide film on the sidewall,
   wherein the silicide film on the gate electrode and a tungsten film formed on the silicide film do not exceed the height of the sidewall and simultaneously, a tungsten film is formed on the source and drain regions without forming a tungsten-silicide film.

6. A fabrication method of a semiconductor device, comprising the steps of:
   (a) successively forming a first conductor film and a first insulator film that contains phosphorous on a semiconductor substrate;
   (b) successively etching out unnecessary portions of the first insulator film and the first conductor film so as to form a gate electrode portion comprising the first conductor film and the first insulator film;
   (c) forming a second insulator film on the resultant semiconductor substrate;
   (d) etching out the second insulator film until the first insulator film on the gate electrode portion is exposed so as to form a sidewall on a side surface of the gate electrode portion;
   (e) selectively removing the first insulator film with an etchant that contains at least fluoric acid;
   (f) implanting impurities in the resultant semiconductor substrate after step (e) so as to form a source and drain region;
   (g) selectively forming a tungsten film on the gate electrode and the source and drain regions without forming a tungsten-silicide film on the sidewall;
   (h) forming an oxide film that is an inter-layer insulator film on the field oxide film, the sidewall, and the tungsten film without forming tungsten-silicide film;
   (i) forming openings of contact holes in the oxide film by a lithography method and an etching method; and
   (j) burying metal members in the openings of contact holes;
   wherein the tungsten film on the gate electrode does not exceed the height of the sidewall.

7. The fabrication method as set forth in claim 3, wherein the first insulator film comprises an oxide film that contains phosphorous.

8. The fabrication method as set forth in claim 3, wherein the first insulator film comprises one of the following: a PSG film and a BPSG film.

9. The fabrication method as set forth in claim 3, wherein the second insulator film comprises one of the following: a silicon nitride film and a silicon oxide film.

10. The fabrication method as set forth in claim 2, wherein the etchant contains 60% to 100% fluoric acid by weight.

11. The fabrication method as set forth in claim 5, wherein the second conductor film comprises one of the following: titanium, cobalt, nickel, and zirconium.

* * * * *